(12) United States Patent
Shin

(10) Patent No.: US 8,305,348 B2
(45) Date of Patent: Nov. 6, 2012

(54) DISPLAY DEVICE, METHOD OF MANUFACTURING THE SAME AND MOBILE COMMUNICATION TERMINAL HAVING THE SAME

(75) Inventor: Jeong-Hwan Shin, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 996 days.

(21) Appl. No.: 11/834,296

(22) Filed: Aug. 6, 2007

(65) Prior Publication Data

US 2008/0030475 A1   Feb. 7, 2008

(30) Foreign Application Priority Data

Aug. 7, 2006   (KR) .................. 10-2006-0074196

(51) Int. Cl.
*G09G 5/00* (2006.01)

(52) U.S. Cl. .............. 345/169; 345/168; 455/575.1; 455/575.3; 455/575.4; 361/679.28; 361/679.3; 361/679.39

(58) Field of Classification Search .......... 345/168, 345/169; 455/575.1, 575.3, 575.4; 361/679.28, 361/679.3, 679.39
See application file for complete search history.

(56) References Cited

U.S. PATENT DOCUMENTS

| | | | | |
|---|---|---|---|---|
| 5,691,509 A | * | 11/1997 | Balzano | 174/117 F |
| 6,045,368 A | * | 4/2000 | Cadenhead et al. | 439/67 |
| 6,166,342 A | * | 12/2000 | Chou | 200/344 |
| 6,444,923 B1 | * | 9/2002 | Iriguchi et al. | 174/261 |
| 6,870,590 B2 | * | 3/2005 | Shoji | 349/152 |
| 6,961,593 B1 | * | 11/2005 | Lonka et al. | 455/573 |
| 7,144,257 B2 | * | 12/2006 | Yumoto et al. | 439/67 |
| 7,229,289 B2 | * | 6/2007 | Bang | 439/31 |
| 7,462,793 B2 | * | 12/2008 | Jang | 200/310 |
| 8,081,285 B2 | * | 12/2011 | Yumoto et al. | 349/152 |
| 2002/0137476 A1 | * | 9/2002 | Shin | 455/90 |
| 2003/0081375 A1 | * | 5/2003 | Yamamoto | 361/681 |
| 2004/0212012 A1 | * | 10/2004 | Yamazaki et al. | 257/347 |
| 2005/0221873 A1 | * | 10/2005 | Kameyama et al. | 455/575.4 |
| 2005/0231495 A1 | * | 10/2005 | Ishibashi | 345/204 |
| 2006/0232524 A1 | * | 10/2006 | Cok | 345/82 |
| 2006/0266632 A1 | * | 11/2006 | Jang | 200/310 |
| 2007/0105604 A1 | * | 5/2007 | Choo et al. | 455/575.3 |
| 2007/0202720 A1 | * | 8/2007 | Ha et al. | 439/83 |
| 2008/0026802 A1 | * | 1/2008 | Carlson | 455/575.1 |

\* cited by examiner

*Primary Examiner* — Lun-Yi Lao
*Assistant Examiner* — Gregory J Tryder
(74) *Attorney, Agent, or Firm* — F. Chau & Associates, LLC

(57) ABSTRACT

A display device includes a display panel, an integral type printed circuit board electrically connecting the display panel and a signal transmission member formed on a rear side of the integral type printed circuit board to transmit the input signal. The integral type printed circuit board comprises a driving circuit member applying a driving signal to the display panel, and an input circuit member integrally formed with the driving circuit member to generate an input signal.

23 Claims, 10 Drawing Sheets

DISPLAY DEVICE, METHOD OF MANUFACTURING THE SAME AND MOBILE COMMUNICATION TERMINAL HAVING THE SAME

CROSS-REFERENCE TO RELATED APPLICATION

The present application claims priority to Korean Patent Application No. 2006-74196, filed on Aug. 7, 2006, the disclosure of which is incorporated herein by reference in its entirety.

BACKGROUND OF THE INVENTION

1. Technical Field

The present disclosure relates to a display device, a method of manufacturing the display device and a mobile communication terminal having the display device, and more particularly, to a display device having a reduced thickness.

2. Discussion of the Related Art

Various mobile communication terminal devices, such as a cell phone and a personal digital assistant (PDA), have been used. The mobile communication terminal devices include display devices to display images. However, a size and thickness of the display devices can be increased since various components are used in connection with the display devices for performing different functions of the mobile communication terminal devices.

When the size and thickness of the mobile communication terminal device are increased, a portability of the mobile communication terminal device can be compromised.

When the number of parts of the mobile communication terminal device is increased, assembly processes can be complicated, and manufacturing time and cost can be increased.

SUMMARY OF THE INVENTION

Exemplary embodiments of the present invention provide a display device having a reduced thickness, a method of manufacturing the display device, and a mobile communication terminal device having the display device.

According to an exemplary embodiment of the present invention, a display device comprises a display panel, an integral type printed circuit board electrically connecting the display panel, and a signal transmission member formed on a rear side of the integral type printed circuit board to transmit the input signal. The integral type printed circuit board may include a driving circuit member applying a driving signal to the display panel and an input circuit member integrally formed with the driving circuit member to generate an input signal. The integral type printed circuit board can be disposed substantially parallel with the display panel.

According to an exemplary embodiment of the present invention, a method of manufacturing a display device comprises forming an integral type printed circuit board combining a driving circuit member to apply a driving signal to a display panel with an input circuit member to generate an input signal, combining the integral type printed circuit board with the display panel, forming a signal transmission member on a rear side of the integral type printed circuit board, inserting the signal transmission member into an opening portion, aligning the integral type printed circuit board and the display panel on a lower case, and combining an upper case with the lower case to fix the integral type printed circuit board and the display panel.

According to an exemplary embodiment of the present invention, a mobile communication terminal device comprises a main module, a display device combining the main module, and a container containing the display panel and the integral type printed circuit board. The display device may comprise a display panel, an integral type printed circuit board electrically connecting the display panel, the integral type printed circuit board including a driving circuit member applying a driving signal to the display panel and an input circuit member integrally formed with the driving circuit member to generate an input signal, and a signal transmission member disposed on a rear side of the integral type printed circuit board, the signal transmission member transmitting the input signal to the main module. The display device can be combined with the main module. The display device can slide over the main module.

BRIEF DESCRIPTION OF THE DRAWINGS

Exemplary embodiments of the present invention can be understood in more detail from the following descriptions taken in conjunction with the accompanying drawings, in which.

DESCRIPTION OF EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein.

It will be understood that when an element or layer is referred to as being "on," or "connected to" another element or layer, it can be directly on or connected to the other element or layer or intervening elements or layers may be present.

Figure 1:
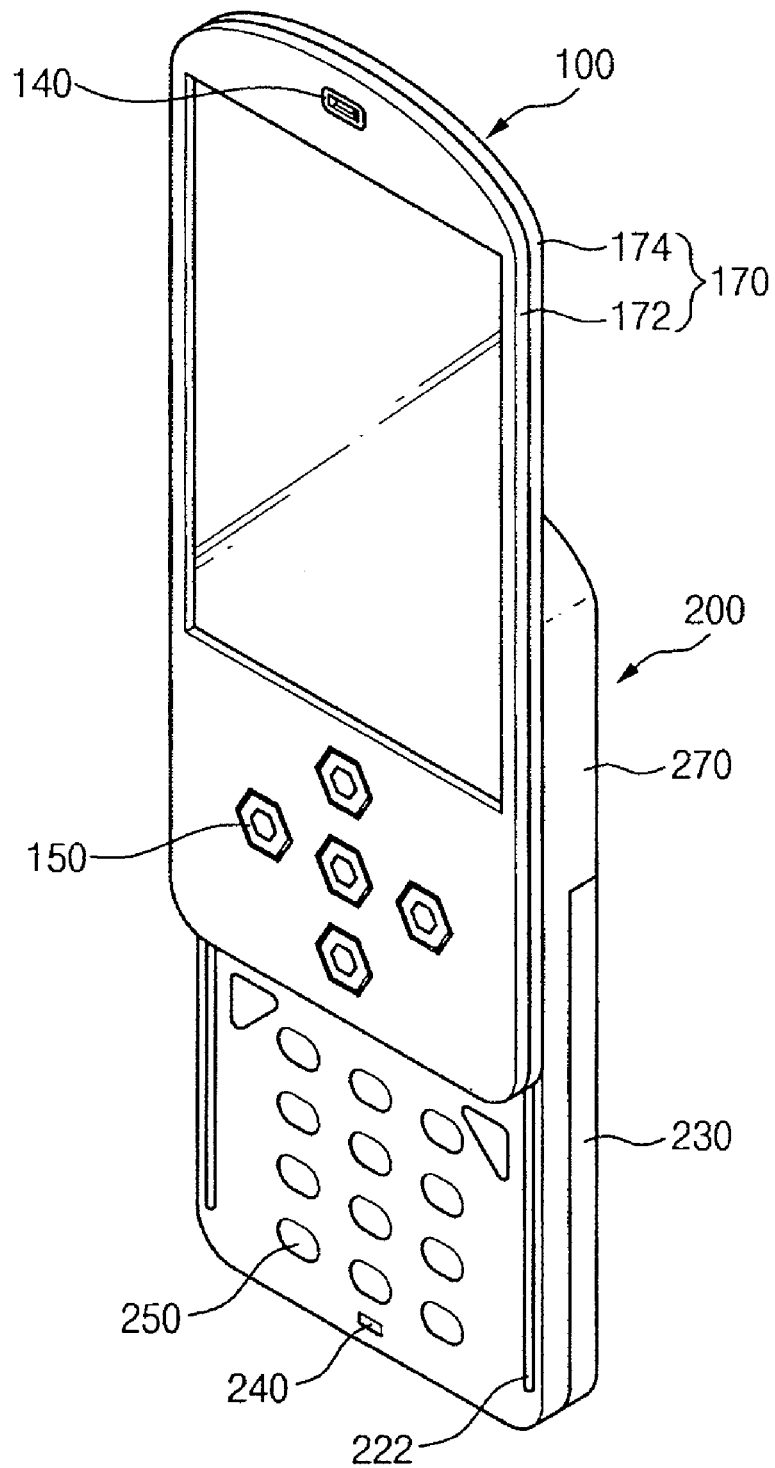
FIG. 1 is a perspective view showing a mobile communication terminal device according to an exemplary embodiment of the present invention.

FIG. 1 is a perspective view showing a mobile communication terminal device according to an exemplary embodiment of the present invention.

Referring to FIG. 1, a mobile communication terminal device may comprise a main module 200 and a display device 100. The display device 100 may be combined with the main module 200 by a sliding moving contact.

The main module 200 may comprise a wireless transceiver unit (not shown), a main keypad 250, and a microphone 240. The main keypad 250 is electrically connected to the wireless transceiver unit (not shown) to apply a main input signal to the wireless transceiver unit (not shown).

The microphone 240 converts vibration energy of air into an electrical signal to apply the electric signal to the wireless transceiver unit (not shown). In an embodiment, the main keypad 250 can be positioned under the main module 200.

The main module 200 may comprise a main container 270 to contain the main keypad 250, the microphone 240 and a battery 230 to provide a power to the wireless transceiver unit (not shown).

In an embodiment, the main container 270 may include a guiding groove 222 formed on an upper surface of the main container 270. Alternatively, the main container 270 may include a plurality of guiding grooves 222. The display device 100 may include a guiding protrusion (not shown) formed on a lower surface of the display device 100. Alternatively, the display device 100 may include a plurality of guiding protrusions. The guiding protrusion (not shown) may correspond to the guiding groove 222. Thus, the main container 270 can guide movement of the display device 100. In an embodiment, the main container 270 may include the guiding protrusion, and the display device 100 may include the guiding groove.

When the display device 100 moves upwardly, the main keypad 250 of the main module 200 is exposed.

Figure 2:
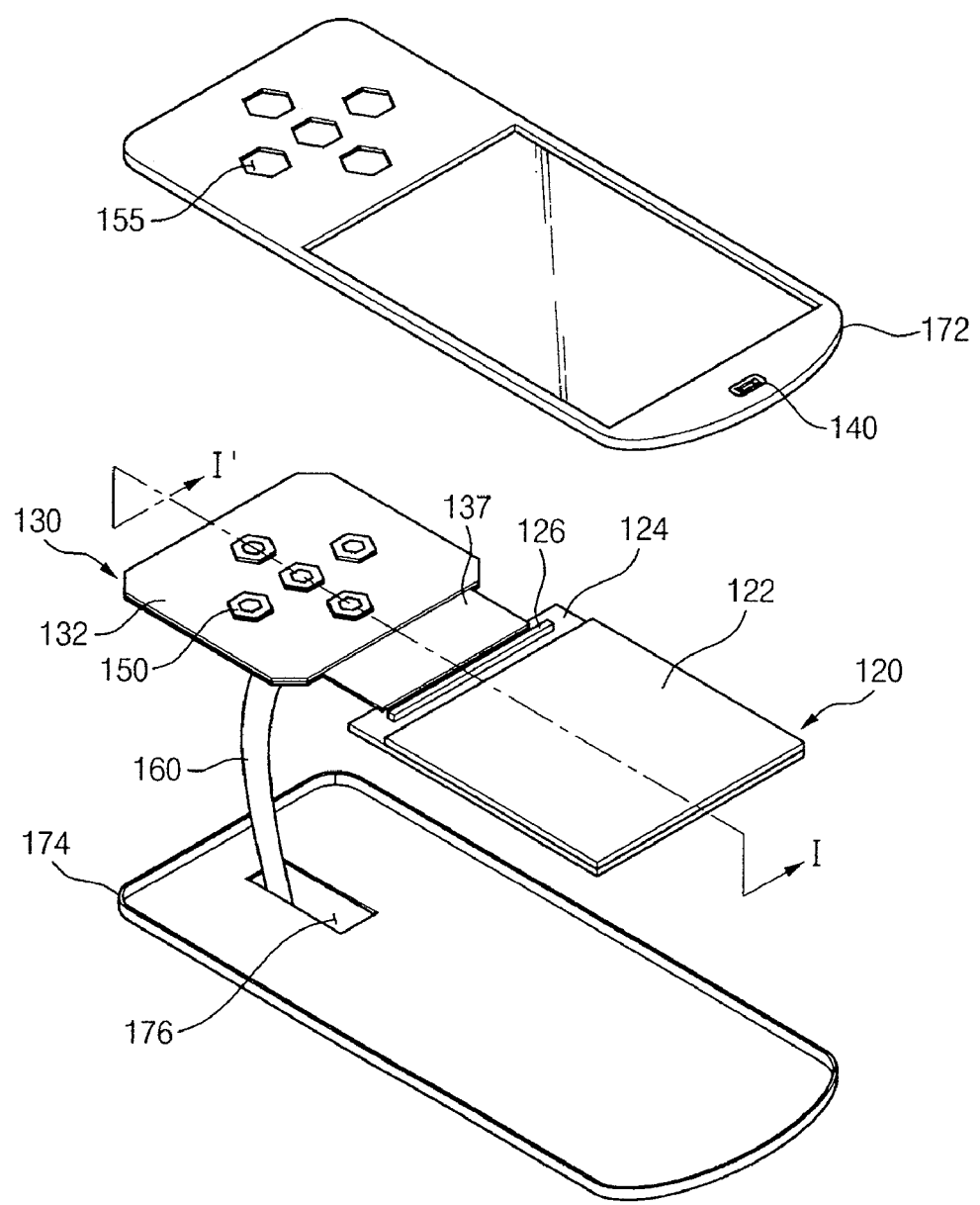
FIG. 2 is an exploded perspective view showing a display device according to an exemplary embodiment of the present invention.

FIG. 2 is an exploded perspective view showing a display device according to an exemplary embodiment of the present invention.

Referring to FIG. 1 to FIG. 2, the display device 100 may include a display panel 120, an integral type printed circuit board 130, and a signal transmission member 160. In an embodiment, the display device 100 may further include a sliding container 170 and a speaker 140.

The sliding container 170 may include an upper case 172 and a lower case 174.

The lower case 174 may include an open portion 176 to receive the signal transmission member 160. The lower case 174 can support the display panel 120 and the integral type printed circuit board 130.

The signal transmission member 160 can be connected to the main module 200 through the open portion 176. In an embodiment, the open portion 176 may be extended in a direction substantially parallel with a longitudinal direction of the display device 100. Thus, when the display device 100 moves, the signal transmission member 160 can be electrically connected to the main module 200 since the signal transmission member 160 can move along the open portion 176 extended in a direction substantially parallel with a longitudinal direction of the display device 100.

The lower case 174 may further include a guiding protrusion (not shown) corresponding to the guiding groove 222 of the main module 200. The guiding protrusion (not shown) may be formed on a lower surface of the lower case 174.

The upper case 172 can be combined with the lower case 174 to contain the display panel 120 and the integral type printed circuit board 130. The speaker 140 can be combined with the upper case 172. The signal transmission member 160 can be electrically connected to the speaker 140 through signal lines (not shown). A voice signal generated from the main module 200 can transmit to the speaker 140 through the signal transmission member 160.

Figure 3:
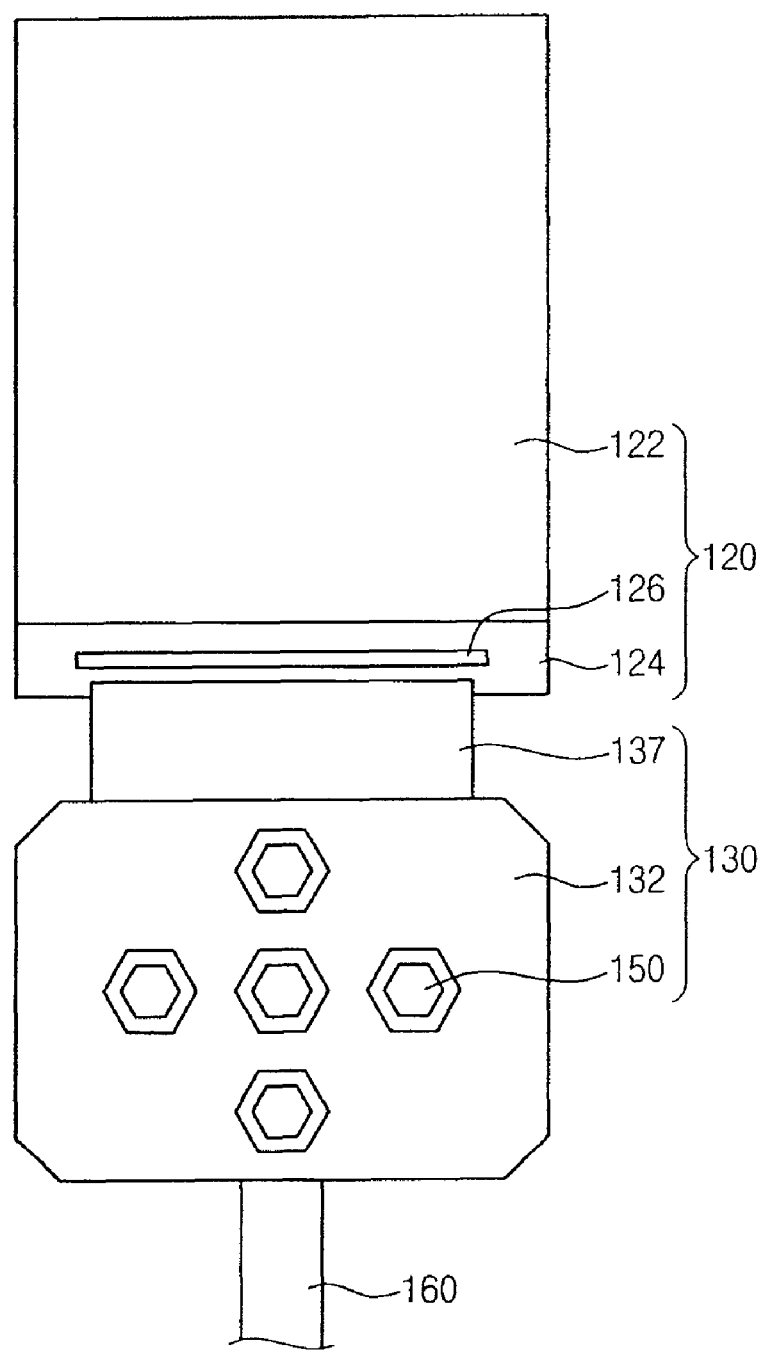
FIG. 3 is a plan view showing a front side of a display panel, an integral type printed circuit board and a signal transmission member according to an exemplary embodiment of the present invention.
Figure 4:
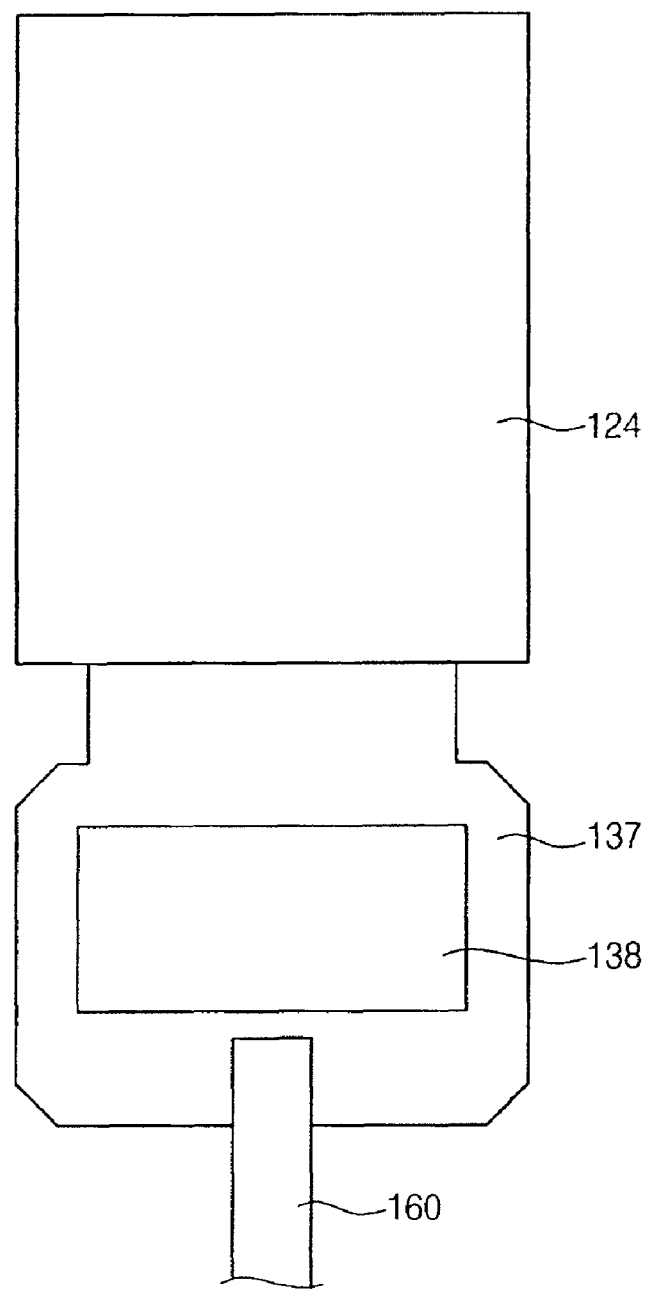
FIG. 4 is a plan view showing a rear side of display panel, an integral type printed circuit board and a signal transmission member according to an exemplary embodiment of the present invention.
Figure 5:
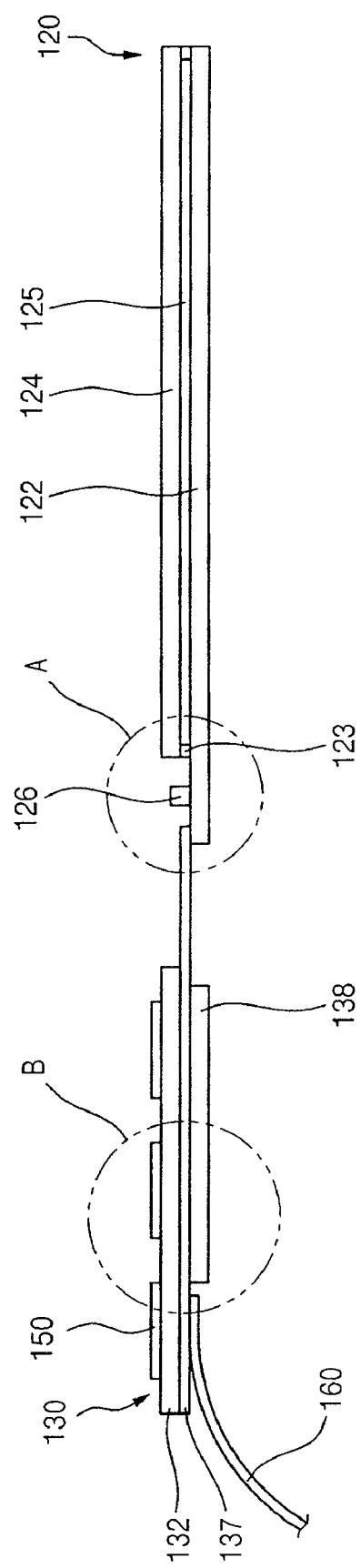
FIG. 5 is a cross-sectional view taken along the line I-I' shown in FIG. 2.

FIG. 3 is a plan view showing a front side of a display panel, an integral type printed circuit board and a signal transmission member according to an exemplary embodiment of the present invention. FIG. 4 is a plan view showing a rear side of display panel, an integral type printed circuit board and a signal transmission member according to an exemplary embodiment of the present invention. FIG. 5 is a cross-sectional view taken along the line I-I' shown in FIG. 2.

Referring to FIG. 3 to FIG. 5, the integral type printed circuit board 130 is positioned adjacent to the side part of the display panel 120, and the integral type printed circuit board 130 can apply a driving signal to the display panel 120.

In an embodiment, the integral type printed circuit board 130 may be connected to the display panel 120 without overlapping the integral type printed circuit board 130 and the display panel 120.

The integral type printed circuit board 130 may include a driving flexible circuit board 137 and an input printed circuit board 132. The driving flexible circuit board 137 can be electrically connected to the display panel 120 to apply a driving signal to the display panel 120. The driving flexible circuit board 137 may include, for example, an insulating substrate. In an embodiment, the flexible circuit board 137 may include, for example, a flexible synthetic resin substrate.

The input printed circuit board 132 may be disposed on the driving flexible circuit board 137. The input printed circuit board 132 may be integrally formed with the driving flexible circuit board 137.

The input printed circuit board 132 applies the input signal to the main module 200 through the signal transmission member 160. In an embodiment, a transmission pattern (not shown) is formed on the driving flexible circuit board 137 so that the transmission pattern (not shown) may be electrically connected to the input printed circuit board 132 to transmit the input signal to the signal transmission member 160. Alternatively, the transmission pattern may be formed under the driving flexible circuit board 137 or the input printed circuit board 132.

The input printed circuit board 132 may include a keypad 150 as a user input interface and an input circuit (not shown). In an embodiment, when the keypad 150 as the user interface is subject to an external pressure, the input circuit (not shown) generates an input signal. The keypad 150 as the user interface may include, for example, a light sensor switch, a push button switch, a membrane switch, etc. These may be used alone or in a combination thereof.

The signal transmission member 160 may be positioned behind the driving flexible circuit board 137, and the signal transmission member 160 may be electrically connected to the driving flexible circuit board 137 and the input printed circuit board 132.

The signal transmission member 160 receives an image signal and a control signal supplied from the main module 200. The signal transmission member 160 transmits the image signal and the control signal to the driving flexible circuit board 137. The signal transmission member 160 transmits the input signal supplied from the input printed circuit board 132 to the main module 200.

In an embodiment, the voice signal from the main module 200 is transmitted to the signal transmission member 160, and the voice signal from the signal transmission member 160 is transmitted to the speaker 140. Moreover, a portion of the signal transmission member 160 may be extended toward the input printed circuit board 132 and/or the speaker 140 to transmit the input signal and the voice signal.

Figure 6:
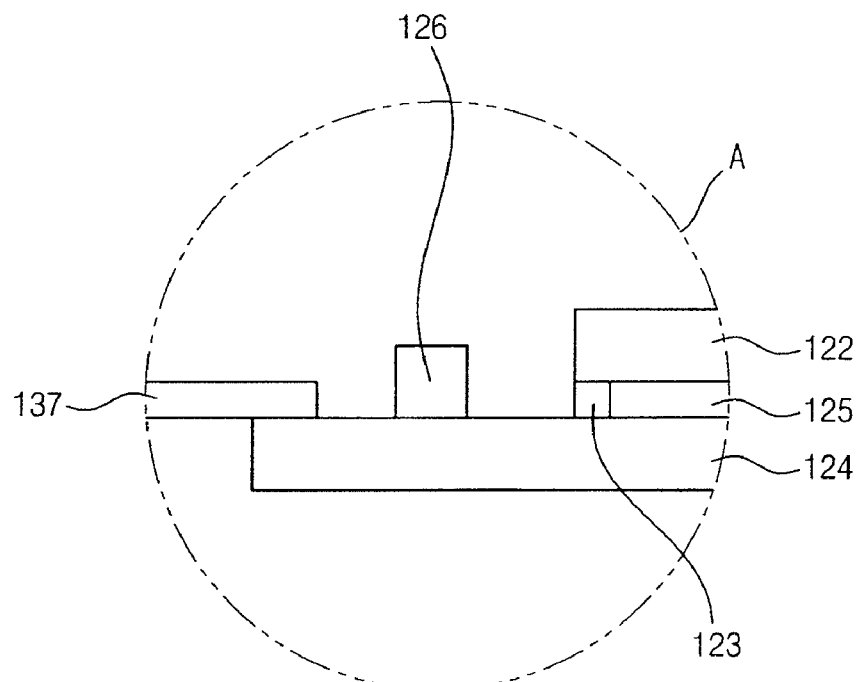
FIG. 6 is an enlarged cross-sectional view showing a portion 'A' shown in FIG. 5.

FIG. 6 is an enlarged cross-sectional view showing a portion 'A' shown in FIG. 5.

Referring to FIG. 5 and FIG. 6, the display panel 120 includes an array substrate 124, a countering substrate 122, a liquid crystal layer 125, a sealant 123 and an integral driving chip 126. The display panel 120 may further include a shift register (not shown) formed on the array substrate 124.

The driving flexible circuit board 137 may be electrically connected to the array substrate 124 through an anisotropic conductive film to apply a driving signal to the array substrate 124.

The integral driving chip 126 is formed on the array substrate 124. The integral driving chip 126 is positioned adjacent to the driving flexible circuit board 137. The integral driving chip 126 receives the driving signal, and generates an analog signal. In an embodiment, the integral driving chip 126 can be integrated with the array substrate 124.

The array substrate 124 includes a plurality of thin film transistors (not shown) arranged in a matrix and a plurality of pixel electrodes (not shown) electrically connected to the plurality of thin film transistors. Each thin film transistor receives the analog signal, and each thin film transistor applies a voltage corresponding to a predetermined gray scale to each pixel electrode.

The countering substrate 122 faces the array substrate 124, and includes a common electrode (not shown) facing the pixel electrode. The common electrode (not shown) may include, for example, a transparent conductive material.

The liquid crystal layer 125 is interposed between the array substrate 124 and the countering substrate 122. When an electric field is generated between the pixel electrode and the common electrode, an arrangement of liquid crystal molecules of the liquid crystal layer 125 is adjusted so that a light transmittance of the liquid crystal layer 125 varies. Thus, an image corresponding to the gray scale is displayed.

The sealant 123 is interposed between the array substrate 124 and the countering substrate 122. The sealant 123 seals the liquid crystal layer 125.

A backlight assembly (not shown) may be positioned under the display panel 120. The backlight assembly (not shown) may provide light to the display panel 120.

In an embodiment, the display device 100 includes the driving flexible circuit board 137 connected to a side part of the display panel 120 without overlapping 120 and 137. The driving flexible circuit board 137 can be folded so that a size of the display device 100 can be decreased.

In an embodiment, the display panel 120 includes a liquid crystal display panel. The display panel 120 may further include, for example, an organic electro-luminescence display panel and/or an electrophoretic display panel.

The electrophoretic display panel includes a display substrate (not shown), a countering substrate (not shown), and an electrophoretic display layer (not shown). An electrophoretic capsule of the electrophoretic display layer includes a fluid and a colloid particle. According to an electric field applied to the electrophoretic capsule, optical characteristics of the electrophoretic capsule vary to display an image.

Figure 7:
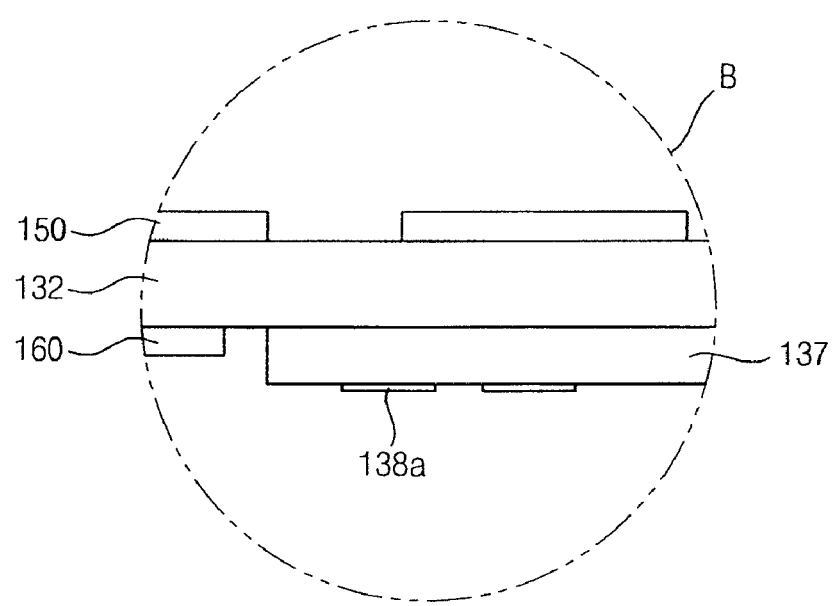
FIG. 7 is an enlarged cross-sectional view showing a portion 'B' shown in FIG. 5.

FIG. 7 is an enlarged cross-sectional view showing a portion 'B' shown in FIG. 5.

Referring to FIG. 5 and FIG. 7, the input printed circuit board 132 is integrally formed with the driving flexible circuit board 137. In an embodiment, a lower side of the input printed circuit board 132 can be attached to an upper side of the driving flexible circuit board 137 with an adhesive.

A portion of the input printed circuit board 132 may be electrically connected to a portion of the driving flexible circuit board 137 through an anisotropic conductive film (not shown). When the input printed circuit board 132 is electrically connected to the driving flexible circuit board 137, the input signal generated from the input printed circuit board 132 is transmitted to the signal transmission member 160 through the anisotropic conductive film and the driving flexible circuit board 137.

The input printed circuit board 132 includes the keypad 150 as the user interface. The keypad 150 as the user interface may be formed on an upper surface of the input printed circuit board 132. The input printed circuit board 132 may further include an input circuit to generate the input signal. In an embodiment, the input circuit can be integrated with the input printed circuit board 132.

The driving flexible circuit board 137 includes a driving circuit 138. In an embodiment, the driving circuit 138 includes a plurality of driving chips 138a positioned on a lower surface of the driving flexible circuit board 137.

The signal transmission member 160 is electrically connected to the driving flexible circuit board 137 through the anisotropic conductive film (not shown). In an embodiment, the signal transmission member 160 may be a flexible printed circuit board.

Referring to FIG. 2, the driving flexible circuit board 137 is combined with the input printed circuit board 132 so that the integral type printed circuit board 130 is formed. In an embodiment, the driving flexible circuit board 137 is attached to the input printed circuit board 132 with an adhesive.

The driving flexible circuit board 137 of the integral type printed circuit board 130 is combined with the display panel 120. For example, an end portion of the driving flexible circuit board 137 is attached to an end portion of the array substrate 124 with the anisotropic conductive film (not shown). The integral type printed circuit board 130 is connected to the display panel 120 without overlapping 130 and 120.

The signal transmission member 160 is attached behind the integral type printed circuit board 130. In an embodiment, the signal transmission member 160 is attached to the integral type printed circuit board 130 by using the anisotropic conductive film.

The signal transmission member 160 is inserted into the open portion 176 of the lower case 174. The integral type printed circuit board 130 and the display panel 120 are positioned on the lower case 174.

The upper case 172 is combined with the lower case 174. The upper case 172 covers the display panel 120 and the integral type printed circuit board 130 to fix the display panel 120 and the integral type printed circuit board 130.

In an embodiment, the input printed circuit board 132 is integrally formed with the driving flexible circuit board 137. The input printed circuit board 132 and the driving flexible circuit board 137 are connected to the display panel 120 without overlapping 132 and 120.

The driving flexible circuit board 137 and the input printed circuit board 132 are integrally formed so that an assembly process of the display device 100 can be simplified and a manufacturing cost can be decreased. A thickness of the display device 100 and the mobile communication terminal display is decreased.

Figure 8:
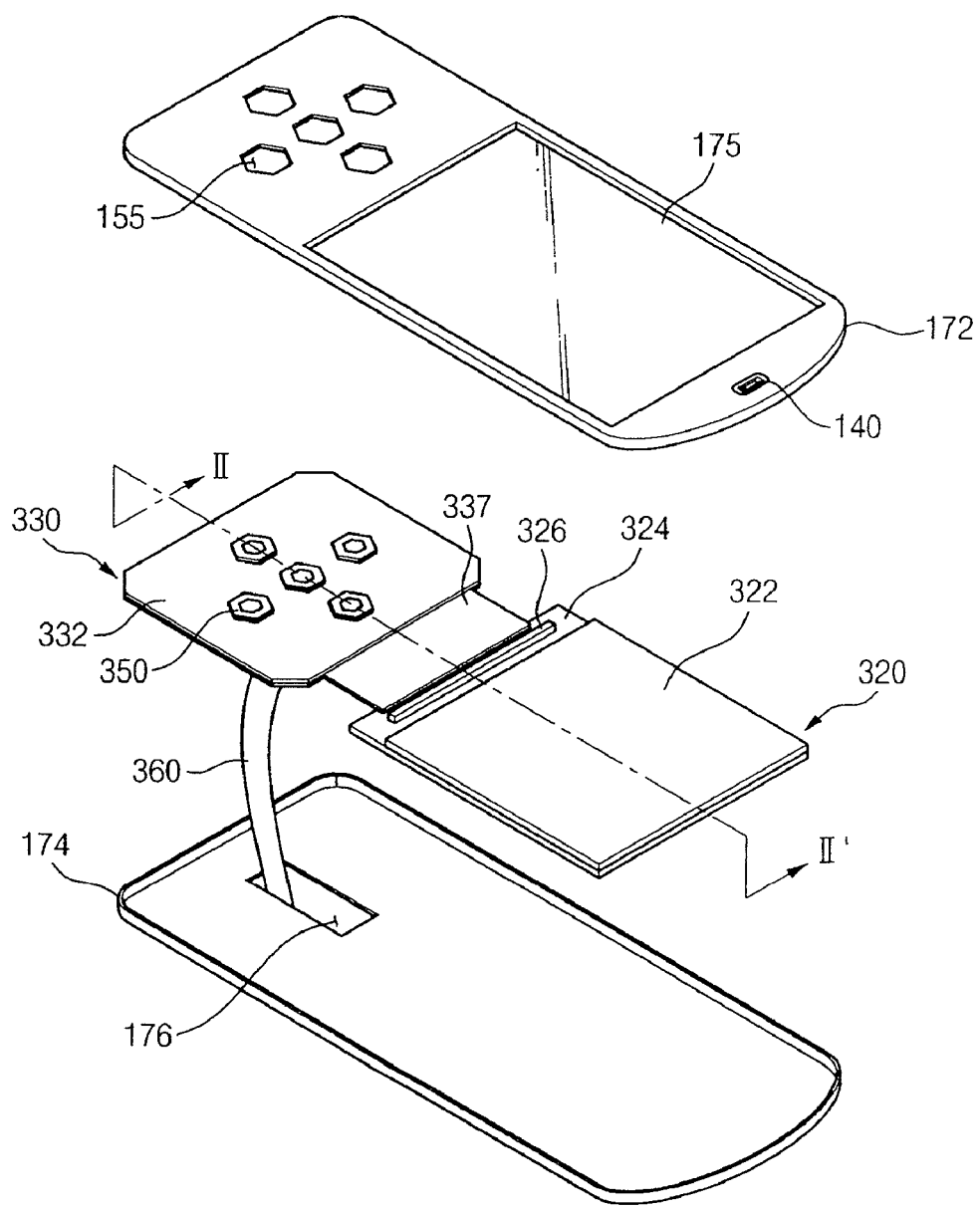
FIG. 8 is an exploded perspective view showing a display device according to an exemplary embodiment of the present invention.

FIG. 8 is an exploded perspective view showing a display device according to an exemplary embodiment of the present invention.

Figure 9:
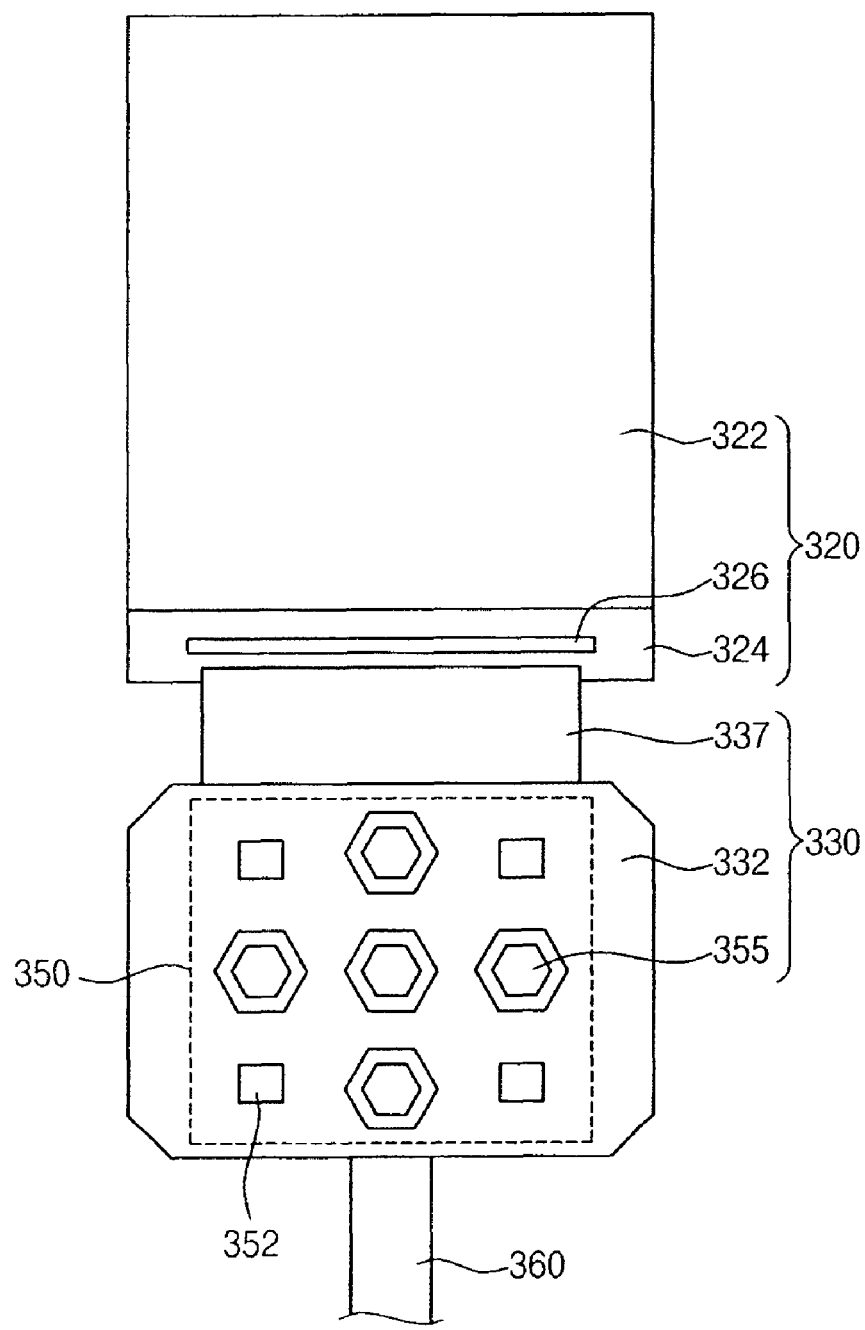
FIG. 9 is a plan view showing a front side of a display panel, an integral type printed circuit board and a signal transmission member according to an exemplary embodiment of the present invention.

FIG. 9 is a plan view showing a front side of a display panel, an integral type printed circuit board and a signal transmission member according to an exemplary embodiment of the present invention.

Figure 10:
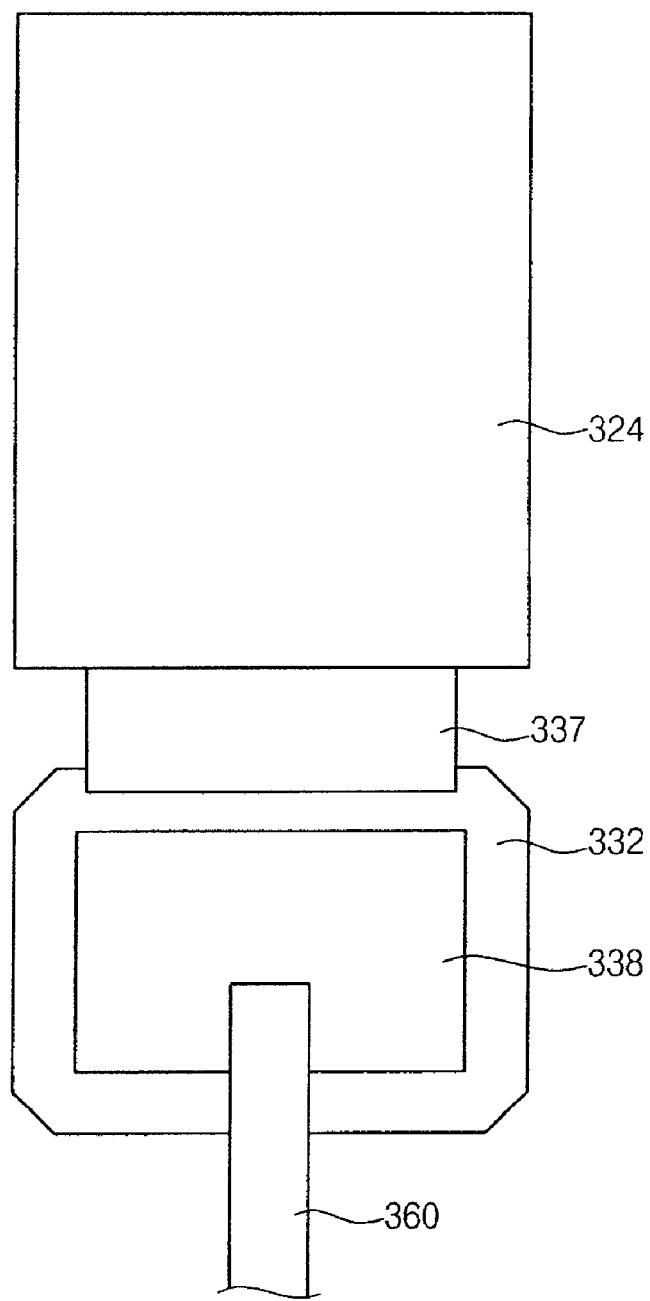
FIG. 10 is a plan view showing a rear side of a display panel, an integral type printed circuit board and a signal transmission member according to an exemplary embodiment of the present invention.

FIG. 10 is a plan view showing a rear side of a display panel, an integral type printed circuit board and a signal transmission member according to an exemplary embodiment of the present invention.

Figure 11:
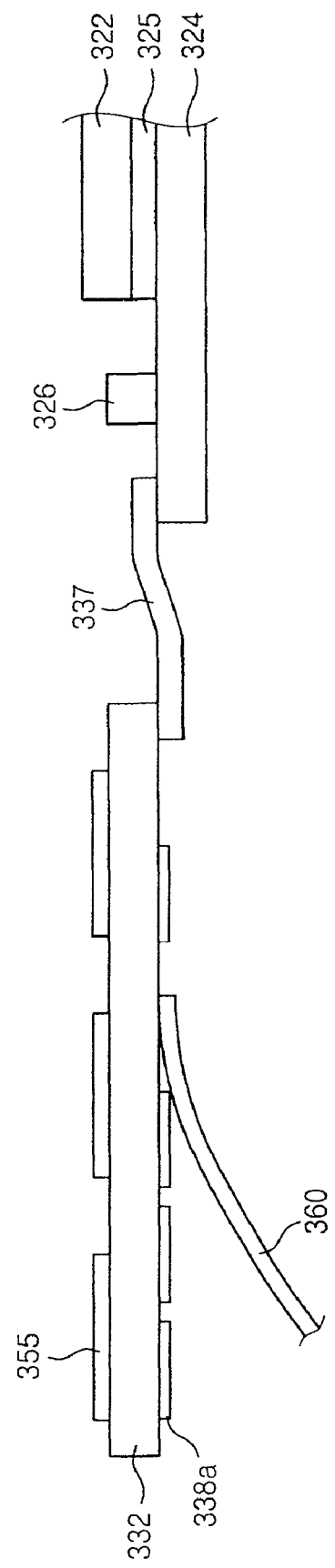
FIG. 11 is a cross-sectional view taken along the line I-H' shown in FIG. 8.

FIG. 11 is a cross-sectional view taken along the line II-II' shown in FIG. 8.

Referring to FIG. 8 to FIG. 11, the display device 100 includes the display panel 320, the integral type printed circuit board 330, the signal transmission member 360, the lower case 174, and the upper case 172.

The display panel 320 includes a display substrate 324, an organic electro-luminescence element 325, a protection layer 322, and a driving chip 326. The display panel 320 is displayed through a window 175 of the upper case 172. In an embodiment, the organic electro-luminescence element 325 is positioned on the display substrate 324, and the protection layer 322 is positioned on the organic electro-luminescence element 325. In an embodiment, the organic electro-luminescence element 325 is positioned under the display substrate 324, and the protection layer 322 is positioned under the organic electro-luminescence element 325.

The organic electro-luminescence element 325 is positioned on the display substrate 324. The organic electro-luminescence element 325 includes a plurality of driving thin film transistors (not shown) arranged in a matrix, a plurality of switching thin film transistors (not shown), a plurality of pixel electrodes, an organic electro-luminescence layer (not shown), and a countering electrode (not shown).

In an embodiment, the plurality of pixel electrodes is positioned on the plurality of driving thin film transistors and the plurality of switching thin film transistors. The organic electro-luminescence layer is positioned on the plurality of pixel electrodes, and the countering electrode is positioned on the organic electro-luminescence layer. Alternatively, the plurality of driving thin film transistors and the plurality of switching thin film transistors can be positioned under the display substrate 324. The plurality of pixel electrodes, the organic electro-luminescence layer, and the countering layer can be positioned under the plurality of driving thin film transistors and the plurality of switching thin film transistors.

Each switching thin film transistor turns on each driving thin film transistor in response to the driving voltage applied from the driving chip 326.

When each driving thin film transistor is turned on, each pixel electrode receives a driving power so that an electric current is generated between the pixel electrode and the countering electrode through the organic electro-luminescence layer. Thus, an electron and a hole are combined in the organic electro-luminescence layer so that an exciton is generated. The organic electro-luminescence layer generates light corresponding to each pixel electrode by using the exciton.

The protection layer 322 covers the organic electro-luminescence element 325. The protection layer 322 protects the organic electro-luminescence element 325 from external impurities such as, for example, moisture and oxygen.

The driving chip 326 is positioned on an end portion of the display substrate 324. The driving chip 326 receives a driving signal, and the driving chip 326 applies an analog image signal to the organic electro-luminescence element 325.

The integral type printed circuit board 330 includes a base board 332, a driving circuit part 338, an input circuit part 350, and a driving flexible circuit board 337.

The base board 332 includes, for example, an insulating substrate. In an embodiment, the base board 332 includes, for example, a synthetic resin substrate having hardness enough to resist a pressure applied from a key input. For example, the base board 332 may comprise hard plastic which is hard enough not to be bent. The base board 332 is positioned adjacent to a side part of the display panel 320. In an embodiment, the base board 332 is connected to the display panel 320 without overlapping 332 and 320.

The driving circuit part 338 is positioned on a lower surface of the base board 332, and the driving circuit part 338 generates a driving signal to drive the display panel 320. In an embodiment, the driving circuit part 338 includes the plurality of driving chips 338a. The driving circuit part 338 can be integrated with the base board 332 through, for example, a thin film deposition process.

The input circuit part 350 is positioned on an upper surface of the base board 332. The input circuit part 350 is exposed through an opening 155 formed through the upper case 172. The input circuit part 350 generates an input signal by the key input.

The input circuit part 350 includes a keypad 355 as an user input interface and an input circuit 352. The input circuit part 350 generates the input signal by the key input of the keypad 355 as the user interface.

The driving flexible circuit board 337 is positioned between the base board 332 and the display panel 320, and transmits the driving signal to the display panel 320.

The driving flexible circuit board 337 is electrically connected to the base board 332 through an anisotropic conductive film (not shown). The driving flexible circuit board 337 is electrically connected to the display substrate 324 of the display panel 320 through the anisotropic conductive film (not shown). The base board 332 may comprise hard plastic.

In an embodiment, the base board 332 includes a base flexible circuit board (not shown). The base flexible circuit board can be electrically connected to the display substrate 324 through the anisotropic conductive film (not shown). The input circuit part 350 is formed on the upper side of the base flexible circuit board and the driving circuit part 338 is formed on the opposite side of the base flexible circuit board. The base flexible circuit board can be electrically connected to the display substrate 324.

When the base substrate 332 includes the base flexible circuit board, the driving flexible circuit board 337 can be omitted.

In an embodiment, the display panel 320 includes an organic electro-luminescence display panel. The display panel 320 may further include, for example, a liquid crystal display panel and an electrophoretic display panel.

Referring to FIG. 8, the input circuit part 350 is formed on the upper side of the base board 332, and the driving circuit part 338 is formed on the opposite side of the base board 332.

A first end portion of the driving flexible circuit board 337 is attached on the base board 332 with the anisotropic conductive film, so that the integral type printed circuit board 330 is formed.

A second end portion of the driving flexible circuit board 337 is attached on an end portion of the display substrate 324 with the anisotropic conductive film. The integral type printed circuit board 330 is connected to the display panel 320 without overlapping 330 and 320.

The signal transmission member 360 can be combined with a lower surface of the integral type printed circuit board 330.

The signal transmission member 360 is inserted into an open portion 176 of the lower case 174. The integral type printed circuit board 330 and the display panel 320 is positioned on the lower case 174.

The upper case 172 is combined with the lower case 174 to fix the display panel 320 and the integral type printed circuit board 330.

According to an exemplary embodiment of the present invention, the input circuit part 350 is integrally formed on the upper side of the base board 332 and the driving circuit part 338 is integrally formed on the opposite side of the base board 332. The integral type printed circuit board 330 is connected to the display panel 320 without overlapping 330 and 320, so that a thickness and size of the mobile communication terminal device having the display device are decreased.

The driving circuit part 338 and the input circuit part 350 are formed on the base board 332 so that an assembly process of the display device is simplified and the manufacturing cost is decreased.

Although the illustrative embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A display device comprising:
    a display panel;
    an integral type printed circuit board electrically connected to the display panel, the integral type printed circuit board including:
        a driving circuit member applying a driving signal to the display panel;
        a key pad; and
        an input circuit member generating an input signal by a key input of the key pad; and
    a signal transmission member transmitting the input signal, wherein the integral type printed circuit board further comprises:
    a base board disposed between the driving circuit member and the input circuit member; and
    a driving flexible circuit board disposed between the base board and the display panel to transmit the driving signal to the display panel, wherein the driving flexible circuit board extends from a position directly on the base board to a position connected to the display panel, wherein the base board and the key pad are sequentially stacked on the driving flexible circuit board so that the base board is interposed between the key pad and the driving flexible circuit board, and wherein the driving flexible circuit board covers an entire lower surface of the base board overlapping the key pad.

2. The display device of claim 1, wherein the driving circuit member comprises a flexible circuit board having an end portion attached to the display panel.

3. The display device of claim 1, wherein the input circuit member comprises a synthetic resin board attached to the driving circuit member.

4. The display device of claim 1, further comprising:
    a container containing the display panel and the integral type printed circuit board, the container including an open portion receiving the signal transmission member.

5. The display device of claim 4, wherein the container comprises a first case supporting the display panel and the integral type printed circuit board, and a second case coupled with the first case to fix the display panel and the integral type printed circuit board.

6. The display device of claim 5, wherein at least one of a guiding groove and a guiding protrusion is formed on a first surface of the first case.

7. The display device of claim 6, wherein at least one of a plurality of guiding grooves and a plurality of guiding protrusions is formed on the first surface of the first case.

8. The display device of claim 1, wherein the display panel comprises an array substrate electrically connected to the integral type printed circuit board, a countering substrate facing the array substrate, and a liquid crystal layer interposed between the array substrate and the countering substrate.

9. The display device of claim 1, wherein the display panel comprises a display substrate electrically connected to the integral type printed circuit board, an organic electro-luminescence element formed on the display substrate, and a protecting layer covering the organic electro-luminescence element.

10. The display device of claim 1, wherein the input circuit member is integrally formed with driving circuit member.

11. The display device of claim 1, wherein the signal transmission member is formed behind the integral type printed circuit board.

12. The display device of claim 1, wherein the driving flexible circuit board is connected to a side part of the display panel without overlapping the display panel.

13. The display device of claim 1, wherein the integral type printed circuit board is connected to the display panel without overlapping the integral type printed circuit board and the display panel.

14. The display device of claim 1, wherein the driving flexible circuit board is on the base board along an entire length of the base board.

15. A method of manufacturing a display device, the method comprising:
    forming an integral type printed circuit board combining a driving circuit member with an input circuit member having a key pad and an input circuit member generating an input signal by a key input of the key pad;
    combining the integral type printed circuit board with a display panel;
    forming a signal transmission member connected to the integral type printed circuit board;
    inserting the signal transmission member into an open portion formed in a first case;
    aligning the integral type printed circuit board and the display panel on the first case; and
    combining a second case with the first case to fix the integral type printed circuit board and the display panel,
    wherein the driving circuit member comprises a flexible circuit board, and wherein forming the integral type printed circuit board comprises:
    forming the flexible circuit board on a first surface of a base board;
    forming the input circuit member on a second surface of the base board opposite the first surface; and
    extending the flexible circuit board from a position directly on the first surface of the base board to a position connected to the display panel, wherein the base board and the key pad are sequentially stacked on the flexible circuit board so that the base board is interposed between the key pad and the flexible circuit board, and wherein the flexible circuit board covers the entire first surface of the base board overlapping the key pad.

16. The method of claim 15, wherein forming the integral type printed circuit board further comprises attaching a first side of the driving circuit member to a first side of the input circuit member.

17. The method of claim 15, wherein the flexible circuit board is connected to a side part of the display panel without overlapping the display panel.

18. The method of claim 15, wherein the flexible circuit board is on the first surface of the base board along an entire length of the base board.

19. A mobile communication terminal device comprising:
a main module; and
a display device in combination with the main module, the display device comprising:
  a display panel;
  an integral type printed circuit board electrically connected to the display panel, the integral type printed circuit board including a driving circuit member applying a driving signal to the display panel, a key pad and an input circuit member integrally formed with the driving circuit member to generate an input signal by a key input of the key pad; and
  a signal transmission member connected to the integral type printed circuit board, the signal transmission member transmitting the input signal to the main module; and
a container containing the display panel and the integral type printed circuit board,
wherein the integral type printed circuit board further comprises:
  a base board disposed between the driving circuit member and the input circuit member; and
  a driving flexible circuit board disposed between the base board and the display panel to transmit the driving signal to the display panel, wherein the driving flexible circuit board extends from a position directly on the base board to a position connected to the display panel, wherein the base board and the key pad are sequentially stacked on the driving flexible circuit board so that the base board is interposed between the key pad and the driving flexible circuit board and wherein the driving flexible circuit board covers an entire lower surface of the base board overlapping the key pad.

20. The mobile communication terminal device of claim 19, wherein the main module comprises a first combining member facing the display device, and the container comprises a second combining member receiving the first combining member to slidably couple the main module to the display device.

21. The mobile communication terminal device of claim 19, wherein the main module comprises a main keypad exposed by sliding the display device over the main keypad.

22. The mobile communication terminal device of claim 19, wherein the driving flexible circuit board is connected to a side part of the display panel without overlapping the display panel.

23. The mobile communication terminal device of claim 19, wherein the driving flexible circuit board is on the base board along an entire length of the base board.

* * * * *